United States Patent
Tseng et al.

(10) Patent No.: US 9,607,985 B1
(45) Date of Patent: Mar. 28, 2017

(54) SEMICONDUCTOR DEVICE AND METHOD OF FABRICATING THE SAME

(71) Applicant: UNITED MICROELECTRONICS CORP., Hsin-Chu (TW)

(72) Inventors: I-Ming Tseng, Kaohsiung (TW); Wen-An Liang, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/864,908

(22) Filed: Sep. 25, 2015

(51) Int. Cl.
| | |
|---|---|
| H01L 21/70 | (2006.01) |
| H01L 27/088 | (2006.01) |
| H01L 29/06 | (2006.01) |
| H01L 21/02 | (2006.01) |
| H01L 21/3105 | (2006.01) |
| H01L 21/762 | (2006.01) |
| H01L 21/8234 | (2006.01) |
| H01L 21/306 | (2006.01) |

(52) U.S. Cl.
CPC .... H01L 27/0886 (2013.01); H01L 21/02118 (2013.01); H01L 21/30604 (2013.01); H01L 21/31058 (2013.01); H01L 21/76224 (2013.01); H01L 21/823431 (2013.01); H01L 21/823481 (2013.01); H01L 29/0653 (2013.01)

(58) Field of Classification Search
CPC .............. H01L 21/762; H01L 29/0649; H01L 2027/11833
USPC ................................. 257/506; 438/686–745
See application file for complete search history.

(56) References Cited

U.S. PATENT DOCUMENTS

| | | | |
|---|---|---|---|
| 8,753,940 B1* | 6/2014 | Wei ................ | H01L 21/823431 257/E21.429 |
| 8,987,836 B2* | 3/2015 | Kim ..................... | H01L 29/785 257/288 |
| 2013/0277720 A1 | 10/2013 | Kim et al. | |
| 2013/0277759 A1 | 10/2013 | Chen et al. | |
| 2015/0145065 A1 | 5/2015 | Kanakasabapathy et al. | |

OTHER PUBLICATIONS

Huang, Title of Invention: Fin Structure and Fin Structure Cutting Process, U.S. Appl. No. 14/696,494, filed Apr. 27, 2015.

* cited by examiner

*Primary Examiner* — Sonya D McCall Shepard
(74) *Attorney, Agent, or Firm* — Winston Hsu; Scott Margo (57) ABSTRACT

A semiconductor device and a method of fabricating the same, the semiconductor device includes a substrate, a plurality of fin shaped structures, a first trench and at least one bump. The substrate has a base. The fin shaped structures protrude from the base of the substrate. The first trench recesses from the base of the substrate and has a depth being smaller than a width of each of the fin shaped structures. The at least one bump is disposed on a surface of the first trench.

18 Claims, 6 Drawing Sheets

SEMICONDUCTOR DEVICE AND METHOD OF FABRICATING THE SAME

BACKGROUND OF THE INVENTION

1. Field of the Invention

The invention relates to a semiconductor device and a method of forming the same, and more particularly, to a semiconductor device having fin shaped structures and a method of forming the same.

2. Description of the Prior Art

With the trend in the industry being scaling down the size of the field effect transistors (FETs), three-dimensional or non-planar transistor technology, such as fin field effect transistor technology (FinFET) has been developed to replace planar FETs. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased.

However, layout designs of the FinFET structures still face some issues in conventional FinFET fabrication. Hence, how to improve the current FinFET fabrication and structure for resolving such issue has become an important task in this field.

SUMMARY OF THE INVENTION

It is one of the primary objectives of the present invention to provide a semiconductor device and a method of forming the same, in which, a multiple fin-cut processes is carried out to form a trench being deeper than a shallow trench isolation, to obtain a more reliable semiconductor device.

To achieve the purpose described above, one embodiment of the present invention provides a semiconductor device including a substrate, a plurality of fin shaped structures, a first trench, at least one bump and a second trench. The substrate has a base. The fin shaped structures protrude from the base of the substrate. The first trench recesses from the base of the substrate and has a depth being smaller than a width of each of the fin shaped structures. The at least one bump is only disposed on a surface of the first trench and is lower than the base. The second trench recesses from the base of the substrate and has a depth being smaller than the width of each of the fin shaped structures.

To achieve the purpose described above, another embodiment of the present invention provides a method of forming a semiconductor device including following steps. First of all, a substrate having a base is provided, wherein the substrate has a first region and a second region and a plurality of fin shaped structures is formed on the base. Next, an organic dielectric layer (ODL) is formed, to entirely cover the substrate and the fin shaped structures. Then, the organic dielectric layer disposed in the second region is partially removed, and the fin shaped structures disposed in the second region are partially removed. Subsequently, the fin shaped structures disposed in the second region are further removed, to form a first trench and at least one bump in the second region, wherein the first trench recesses from the base of the substrate and has a depth being smaller than a width of each of the fin shaped structures.

According to these, the semiconductor device and the forming method thereof in the present invention mainly forms a trench lower than the shallow trench isolation through a multi-stepped fin cut process, wherein the trench has a depth being smaller than a width of each of the fin shaped structures. Through forming such trench, the present invention enables to provide better isolation without causing any disturbance to the element formed subsequently. Also, since the trench is formed by progressively removing the dummy fin shaped structures and the organic dielectric layer filled therebetween, the present invention also enables to improve the etching effect of the fin shaped structures, and to keep from collapsing or over-etching issues during the fin cutting process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic diagrams illustrating a method of forming a semiconductor device according to a first embodiment of the present invention, wherein FIG. 1 shows top views of the semiconductor device in forming steps, and FIGS. 2-4 show cross-sectional views of the semiconductor device in forming steps taken along a cross line A-A' in FIG. 1.

DETAILED DESCRIPTION

To provide a better understanding of the present invention, preferred embodiments will be described in detail. The preferred embodiments of the present invention are illustrated in the accompanying drawings with numbered elements.

Figure 1:
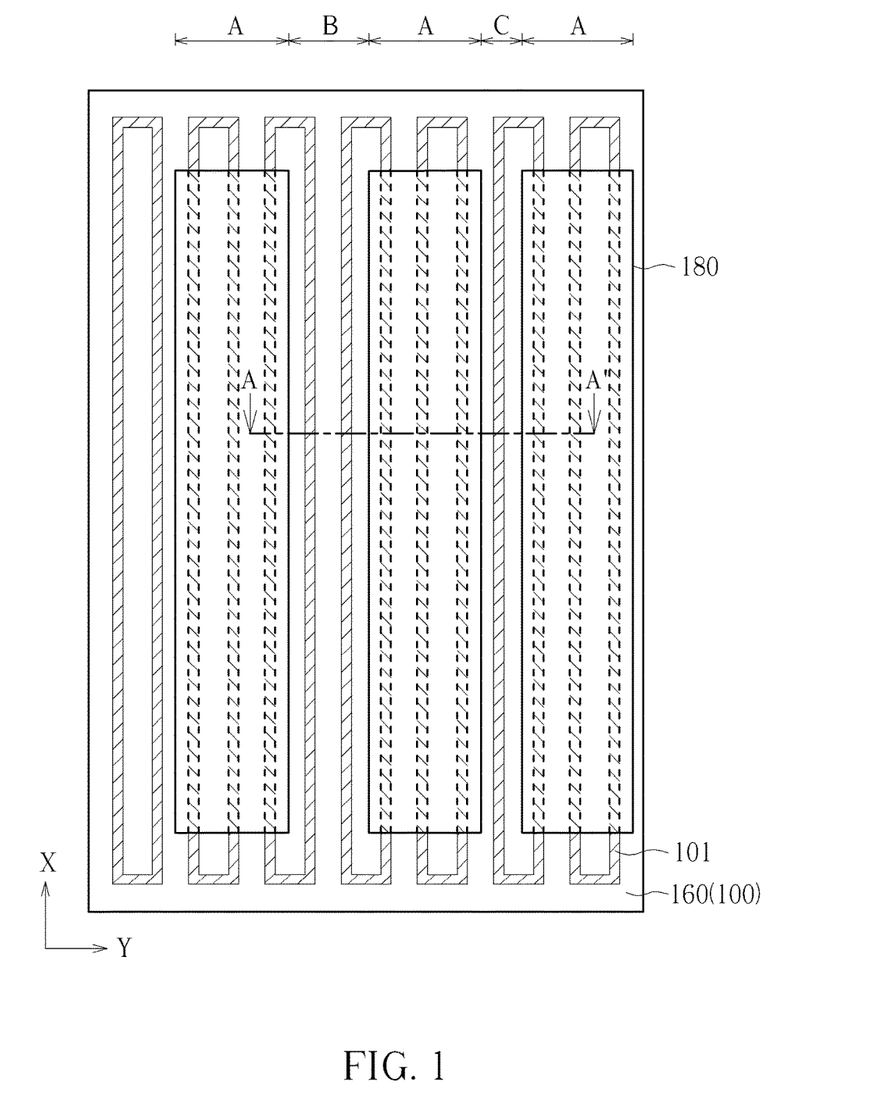
Figure 2:
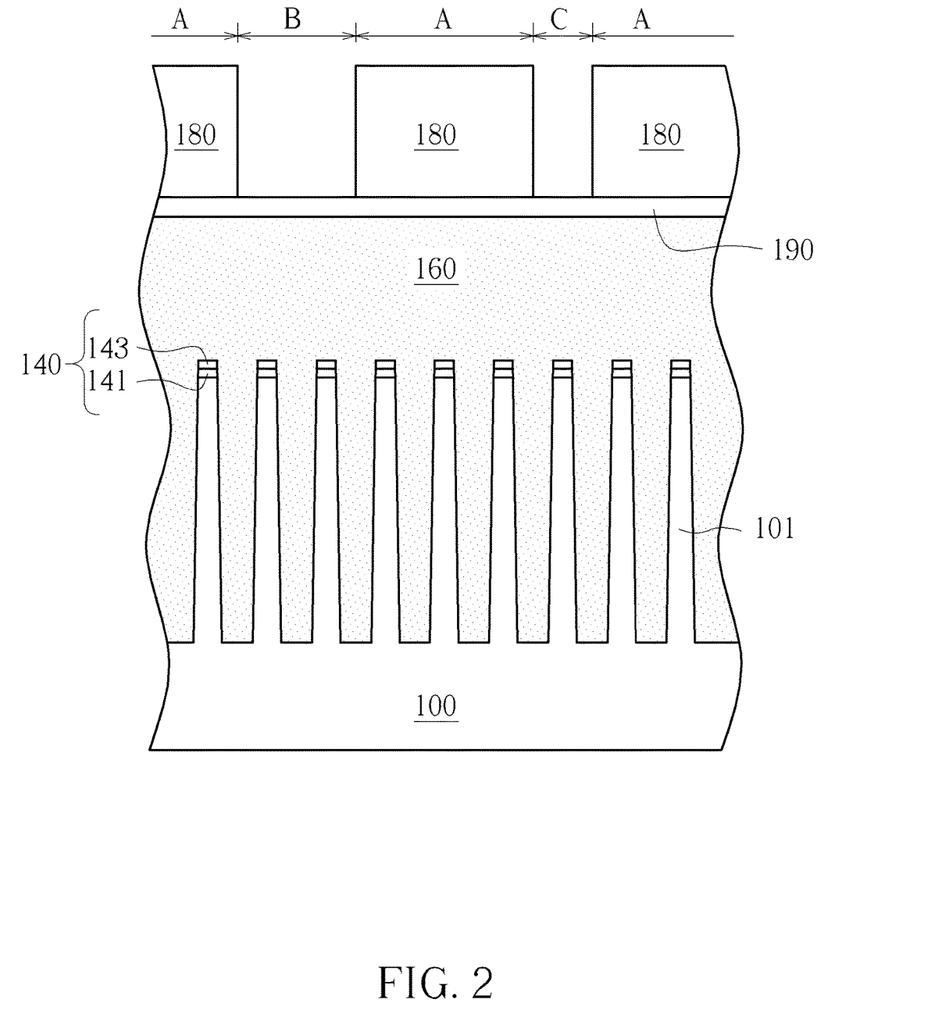
Figure 3:
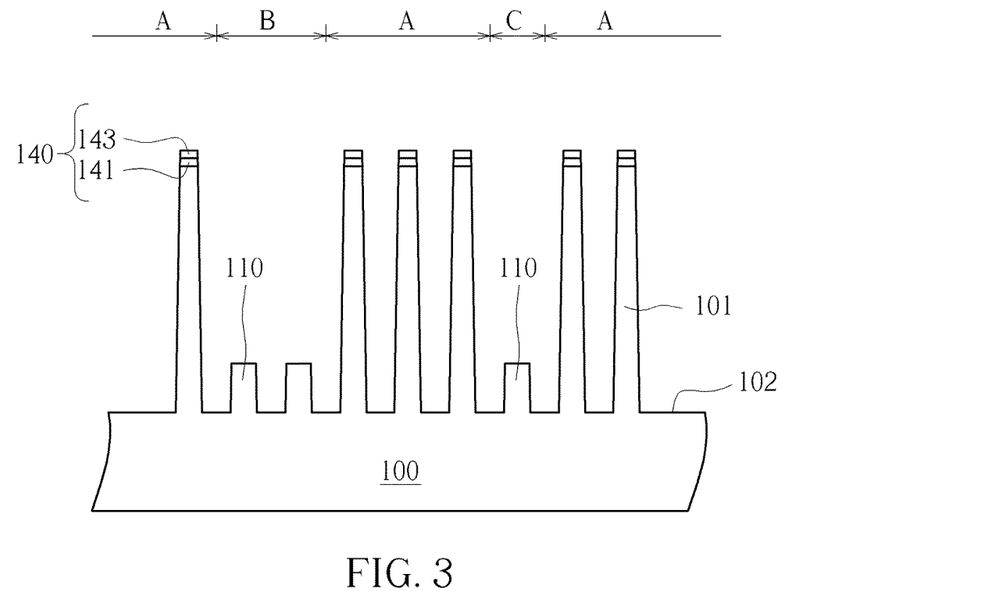
Figure 4:
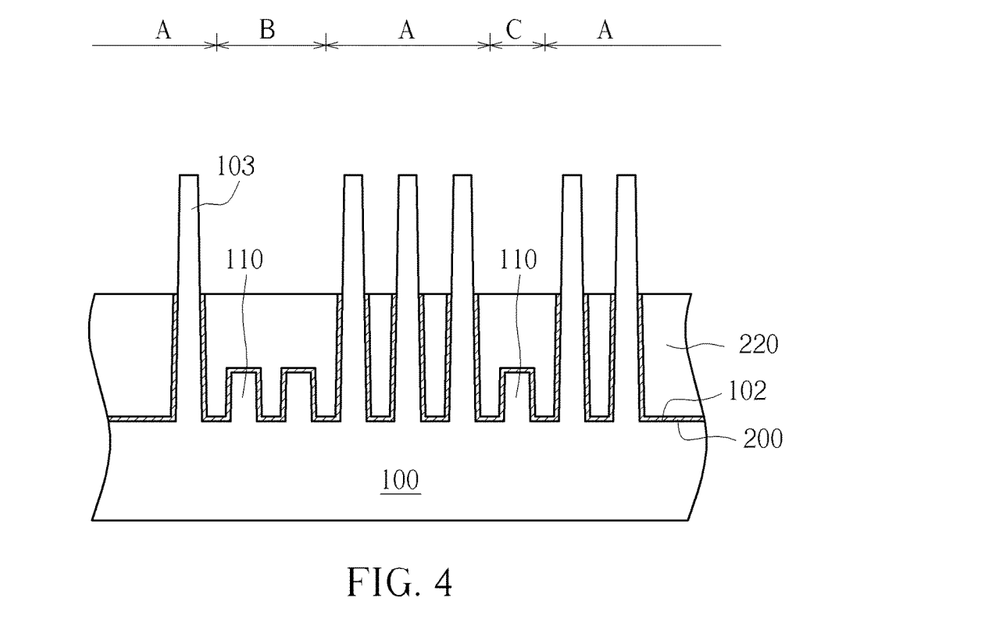

Please refer to FIG. 1 to FIG. 4, which are schematic diagrams illustrating a method of forming a semiconductor device according to the first embodiment of the present invention, wherein FIG. 1 shows top views of the semiconductor device in forming steps, and FIGS. 2-4 show cross-sectional views of the semiconductor device in forming steps taken along a cross line A-A' in FIG. 1. First of all, a substrate 100 is provided and plural regions A, B, C are defined on the substrate 100. The substrate 100 may include a semiconductor substrate, like a silicon substrate a silicon-containing substrate or a silicon-on-insulator (SOI) substrate for example, and a plurality of fin shaped structures 101 is formed on a base 102 of the substrate 100.

In one embodiment of having a bulk silicon substrate, the fin shaped structures 101 may be formed preferably through a self-aligned double-patterning (SADP) process, also known as a sidewall image transfer (SIT) process, but not limited thereto. The SADP process may include forming a plurality of patterned sacrificial layers (not shown in the drawings) on the substrate 100 by using a photolithography and an etching process, performing a depositing and an etching processes sequentially to form a spacer (not shown in the drawings) at sidewalls of each of the patterned sacrificial layers, and then removing the patterned sacrificial layers and performing another etching process by using the spacer as a mask, thereby transferring the patterns of the spacer to a monolayered or a multilayered patterned mask 140, for example a composite mask structure consisting of a silicon oxide layer 141 and a silicon nitride layer 143. After that, another etching process is performed to transfer the patterns of the patterned mask 140 to the substrate 100 underneath, thereby defining the fin shaped structures 101 and the base 102 of the substrate 100. In the present embodiment, the fin shaped structure 101 may have a closed rectangular frame, as shown in FIG. 1.

Alternatively, in another embodiment, the formation of the fin shaped structures 101 may also be accomplished by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium layer. The semiconductor layer may then be used as the corresponding fin shaped structure.

Next, a fin cut process is performed, to remove unnecessary fin shaped structures, like dummy fins and the connection portion at the two ends thereof for example, and to form fin shaped structures 103 in desired layout. Precisely speaking, the fin cut process may include sequentially forming an organic dielectric layer (ODL) 160 covered on the substrate 100 and the fin shaped structures 101, and a patterned mask layer, such as a photoresist layer 180, covered on the organic dielectric layer 160 in the region A. The organic dielectric layer 160 may preferably include a sacrificial material having gap-filling ability and etching selectivity relative to the fin shaped structures 101, so as to fill between the fin shaped structures 101, as shown in FIG. 2. In one embodiment, a hard mask layer, like a silicon containing hard mask (SHB) layer 190 being made of organo-silicon polymers or polysilane for example, may be further formed between the photoresist layer 180 and the organic dielectric layer 160, but is not limited thereto. Preferably, the silicon containing hard mask layer has an etching selectivity relative to the organic dielectric layer 160.

Then, a removing process, such as a dry etching process, a wet etching process or a sequentially performed dry and wet etching process, may be performed by using the photoresist layer 180 as an etching mask, to remove the organic dielectric layer 160 outside the photoresist layer 180 (the organic dielectric layer 160 exposed in the regions B, C) and to partially remove the corresponding fin shaped structures 101 underneath, so that, the fin shaped structures 103 having desired layout, like parallel to each other (not shown in the drawings) for example, may be formed accordingly. It is noted that, while removing the corresponding fin shaped structures 101 (in the regions B, C), those fin shaped structures 101 are not completely removed. Thus, a portion of those fin shaped structures 101 may remain (being incompletely etched), thereby forming a plurality of bumps 110 having a relative less height than that of the fin shaped structures 103. Please also note that, since the bumps 110 are formed according to incompletely etched fin shaped structures 101, the number of the bumps 110 may be equal to the number of the removed fin shaped structures 101.

After that, the photoresist layer 180, the silicon containing hard mask layer 190 and the rest of the organic dielectric layer 160 are completely removed, as shown in FIG. 3. However, people skilled in the art shall easily realize the aforementioned removing process of the present invention is not limited thereto, and may further include other forming methods. For example, in the embodiment of having the silicon containing hard mask layer 190, the patterns of the photoresist layer 180 may firstly transfer to the silicon containing hard mask layer 190 underneath for forming a patterned hard mask layer (not shown in the drawings), the photoresist layer 180 is then removed, and the removing process may be performed by using the patterned hard mask layer as an etch mask.

Following these, a liner 200 and an insulating layer 220 are formed sequentially. The liner 200 may include a single layer structure or multilayer structure, and preferably includes silicon oxide or suitable high dielectric constant materials; the insulating layer 220 may include silicon oxide or other suitable insulating materials. The formations of the liner 200 and the insulating layer 220 may include firstly forming a dielectric material layer (not shown in the drawings) on the substrate 100 and the fin shaped structures 103 through an atomic layer deposition (ALD) process, forming an insulating material layer (not shown in the drawings) on the dielectric material layer through a chemical vapor deposition (CVD) process, such as a flowable chemical vapor deposition (FCVD) process, and then, performing a chemical mechanical polishing (CMP) process and at etching back process, to remove a portion of the insulating material layer and a portion of the dielectric material layer, thereby forming the liner 200 and the insulating layer 220. The liner 200 and the insulating layer 220 only cover a bottom portion of the fin shaped structures 103, as shown in FIG. 4. In other words, a portion of the fin shaped structures 103 may protrude from the insulating layer 220, such that, the insulating layer 220 may function like a shallow trench isolation (STI) surrounding the fin shaped structures 103.

It is worth noting that, the fin shaped structures 103 are at least three times higher than the bumps 110, so that, the insulating layer 220 may completely cover the bumps 110 as shown in FIG. 4, for enhancing the isolation between the fin shaped structures 103. Also, in one embodiment, the patterned mask 140 may be optionally removed or remained while the chemical mechanical polishing process and the etching back process are performed, due to different structural characteristics of tri-gate or dual-gate transistor device formed subsequently, but not limited thereto.

Summarizing these, the semiconductor device according to the first embodiment of the present invention may be obtained through the above-mentioned processes. In the subsequent process, the present invention may be integrated into a conventional semiconductor process, for example, a general gate process, for forming a gate structure (not shown in the drawings) across the fin shaped structures 103. Furthermore, a source/drain process, a selective epitaxial growing (SEG) process, a silicidation process, a contact etching stop layer (CESL) process, an interlayer dielectric layer (ILD) process or a replacement metal gate (RMG) process may be also performed then. Those processes are similar to a conventional forming process of a transistor and will not be further detailed herein. In the aforementioned first embodiment, at least one bump is formed on the base of the substrate after the fin cut process, so as to effectively isolate two adjacent fin shaped structures from each other. However, the bumps are namely disposed above the base. In some case, such bumps may have risk of disturbing the formation of a plug structure or other elements requested to be formed in the subsequent process, and even lead to leakage or poor isolation issues to the semiconductor device.

The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Referring to FIG. 5 to FIG. 9, which are schematic diagrams illustrating a method of forming a semiconductor device according to the second embodiment of the present invention. The formal steps in the present embodiment are similar to those in the first embodiment, and which includes forming the substrate 100 and the fin shaped structures 101 on the base 102 of the substrate 100. However, the differences between the present embodiment and the aforementioned first embodiment are that, after forming the semiconductor structure shown in FIG. 2 of the aforementioned first embodiment, a multi-stepped fin cut process is performed, for forming fin shaped structures 107 in desired layout.

Figure 5:
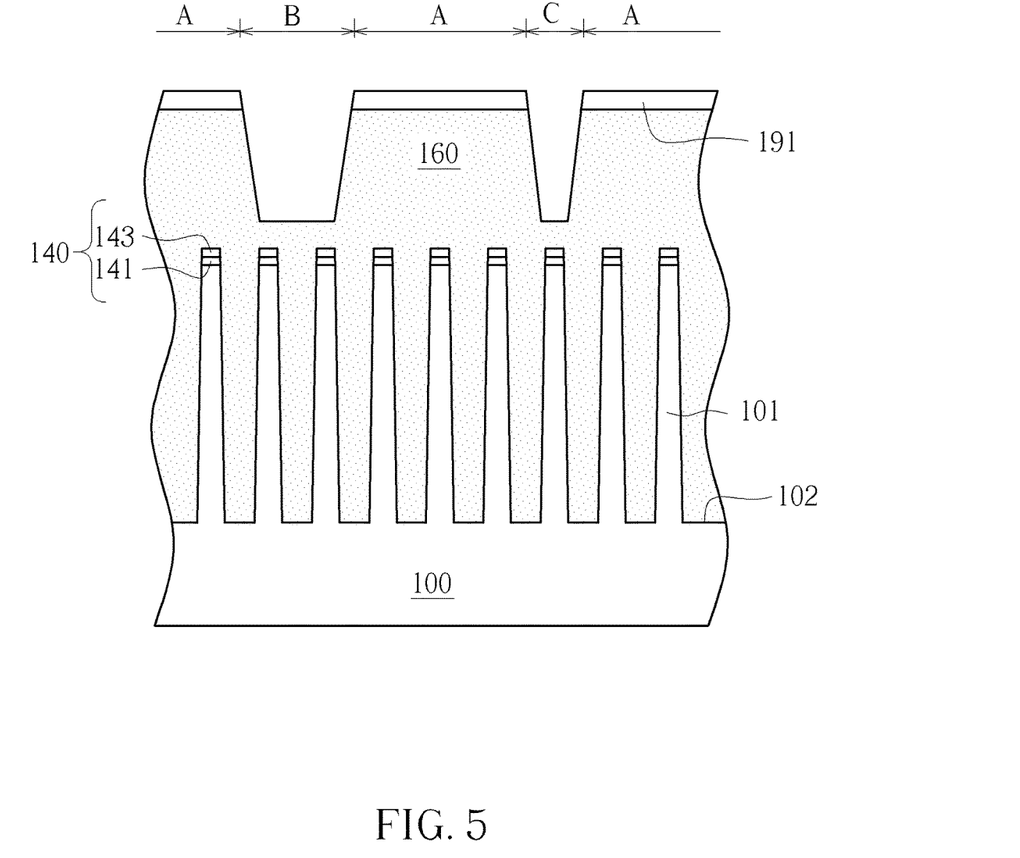
FIG. 5 to FIG. 9 are schematic diagrams illustrating a method of forming a semiconductor device according to a second embodiment of the present invention.

At first, a first-stepped fin cut process is performed preferably through a dry etching process, in which, the organic dielectric layer 160 outside the photoresist layer 180 (namely, the organic dielectric layer 160 within the regions B, C) is partially removed, as shown in FIG. 5. Precisely, in the first-stepped fin cut process, the patterns of the photoresist layer 180 may firstly transfer to the silicon containing hard mask layer 190 underneath, to form a patterned silicon containing hard mask layer 191, and the organic dielectric layer 160 within the regions B, C is partially removed after the photoresist layer 180 is removed, by using the patterned silicon containing hard mask layer 191 as at etching mask, but is not limited thereto. It is noted that, the first-stepped fin cut process is mainly performed by using the etching selectivity between the patterned silicon containing hard mask layer 191 and the organic dielectric layer 160, but is not limited thereto. In the embodiment of omitting the silicon containing hard mask layer 190, the dry etching process may also be performed directly through the photoresist layer 180 by using the etching selectivity between the photoresist layer 180 and the organic dielectric layer 160.

Figure 6:
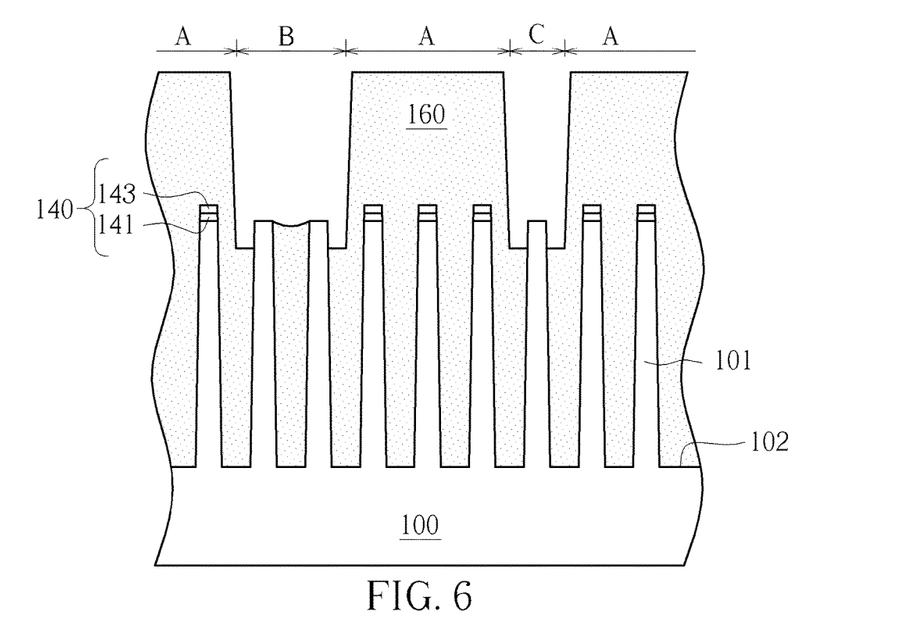

Then, after the patterned silicon containing hard mask layer 191 is removed, a second-stepped fin cut process is performed also through a dry etching process for example, in which the organic dielectric layer 160 within the regions B, C is also partially removed and the corresponding patterned mask 140 underneath is completely removed, as shown in FIG. 6. Precisely, the second-stepped fin cut process may use an etchant having a higher etching selectivity relative to the organic dielectric layer 160 (in comparison with the fin shaped structures 101), so that, a relative greater amount of the organic dielectric layer 160 may be removed till exposing the fin shaped structures 101 within the regions B, C. Thus, the patterned mask 140 disposed on those exposed fin shaped structures 101 may be removed then.

Next, a third-stepped fin cut process is performed also through a dry etching process, and the third-stepped fin cut process may include partially removing the corresponding fin shaped structures 101 in the regions B, C. Precisely, the third-stepped fin cut process is performed by using the etching selectivity between the fin shaped structures 101 and the organic dielectric layer 160, for example including using an etchant having a higher etching selectivity relative to the fin shaped structures 101 (namely, an etching selectivity between the fin shaped structures 101 relative to the organic dielectric layer 160 is substantially greater than 1), such as hydrogen bromide (HBr), hydrogen chloride (HCl), chlorine ($Cl_2$), bromine ($Br_2$) or a combination thereof but not limited thereto, for particularly removing the fin shaped structures 101. In this manner, a relative greater amount of fin shaped structures 101 in the regions B, C is removed, as shown in FIG. 7.

Figure 7:
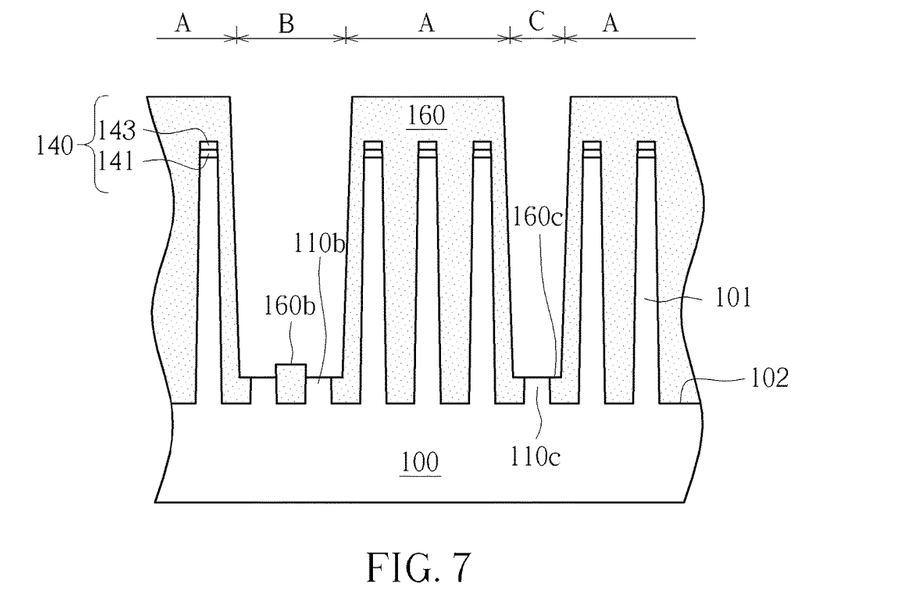

It is noted that, the fin shaped structures 101 are only partially removed in the third-stepped fin cut process, so that, a portion of the fin shaped structures 101 may still remain on the base 102 to form a plurality of bumps 110b, 110c shown in FIG. 7. Also, the number of the bumps 110b, 110c may be equal to the number of the removed fin shaped structures 101 in the regions B, C respectively. Furthermore, it is also noted that, although obtaining a relative lower etching selectivity, the organic dielectric layer 160 within the regions B, C may also be partially removed during the dry etching process, till obtaining a surface 160c being level with the top surface of the bumps 110b, 110c as shown in FIG. 7. However, due to the sheltering between two fin shaped structures 101, the organic dielectric layer 160 therebetween in the regions B may be etched even more slowly, so that, the remaining organic dielectric layer 160 in the regions B may have a relative higher surface 160b than the surface 160c shown in FIG. 7. In other words, if there is more than two fin shaped structures 101 disposed in the regions B, C, the organic dielectric layer 160 between any two of the fin shaped structures 101 may also be sheltered during the third-stepped fin cut process, thereby obtaining a relative higher surface, like the surface 160b for example, but not limited thereto.

Figure 8:
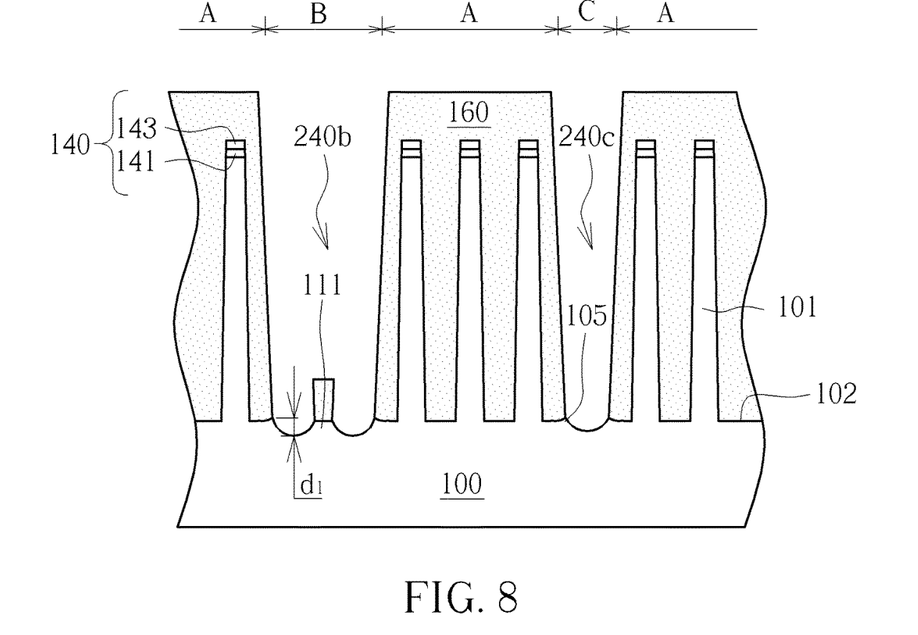

After that, a fourth-stepped fin cut process is performed also through a dry etching process for example, in which the corresponding fin shaped structures 101 (namely, the bumps 110b, 110c) may be further removed and the substrate 100 underneath is also partially removed, to form trenches 240b, 240c and the fin shaped structures 107 in desired layout. Precisely, the fourth-stepped fin cut process is also performed by using the etching selectivity between the fin shaped structures 101 and the organic dielectric layer 160, for example including using an etchant having a higher etching selectivity relative to the fin shaped structures 101 (in comparison with the organic dielectric layer 160), such as hydrogen bromide, hydrogen chloride, chlorine, bromine or a combination thereof, but not limited thereto, for further removing the remaining fin shaped structures 101 within the regions B, C. Under such performance of the etchant, the bumps 110b, 110c, as well as a portion of the substrate 100 underneath, may be completely removed, thereby forming the trenches 240b, 240c in the regions B, C recessed in the substrate 100, as shown in FIG. 8.

It is worth noting that, after completely removing the bumps 110b, 110c, only a small portion of the substrate 100 underneath is removed, so that the trenches 240b, 240c may only slightly recess from the base 102 and preferably have a depth d1 being less than a weight of each fin shaped structures 101. Also, due to the etching selectivity between the organic dielectric layer 160 and the fin shaped structures, sidewalls of the bump 110b, 110c may be slightly sheltered by the organic dielectric layer 160 adjacent thereto, thereby forming a tip portion 105 slightly protruding from the base 102, between the trenches 240b, 240c and the fin shaped structures 107, as shown in FIG. 8. In other words, the tip portion 105 is namely the un-etched sidewalls of the bump 110b, 110c and may be substantially between 1-10 angstroms, but not limited thereto.

It is also worth noting that, due to having a relative higher surfaces 160b, the remaining organic dielectric layer 160 in the regions B may be used as an etch mask in the fourth-stepped fin cut process, so that, a bump 111 may be formed in the substrate 100, right below such remaining organic dielectric layer 160 shown in FIG. 8. Precisely, the bump 111 is formed on a bottom surface of the trench 240b and has a surface level with the base 102. However, people skilled in the art shall easily realize that the number of the bumps 111 is not limited to what is shown in FIG. 8. For example, in the embodiment of having more fin shaped structures (not shown in the drawings) in the region B, a number of the fin shaped structures being removed the region B may be "x", and "x-1" bumps may be formed accordingly.

Figure 9:
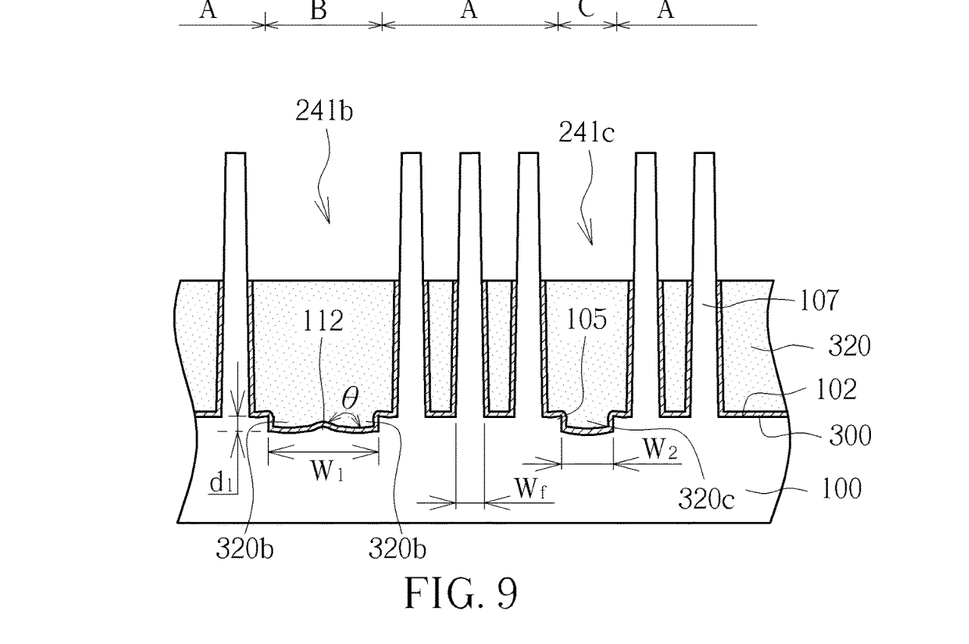

Following these, the rest of the organic dielectric layer 160 is completely removed. Since only a smaller amount of the organic dielectric layer 160 is still disposed on the bump 111 shown in FIG. 8, the bump 111 may be slightly further etched while completely removing the organic dielectric layer 160. In this manner, a bump 112 being lower than the base 102 may be formed accordingly, as shown in FIG. 9. Precisely, the trench 241b may have a width $W_1$ being substantially greater than two times of the width of each fin shaped structures, and the trench 241c may have a width $W_2$ substantially equal to the width $W_f$ of each fin shaped structures, but not limited thereto. On the other hands, the bump 112 may preferably include a smooth rounding surface and substantially have an angle θ to the bottom surface of the trench 240b, wherein the angle θ is substantially greater than 90 degrees, but not limited thereto.

Finally, a liner 300 and an insulating layer 320 are formed sequentially. The liner 300 and the insulating layer 320 only cover a bottom portion of the fin shaped structures 107, and fill in the trenches 241b, 241c. Namely, a portion of the fin shaped structures 107 may protrude from the insulating layer 320, such that, the insulating layer 320 may function like a shallow trench isolation to surround the fin shaped structures 107. Also, the shallow trench isolation further includes protruding portion 320b, 320c in the trenches 241b, 241c, as shown in FIG. 9. It is noted that, due to being disposed between the protruding portions 320b, the number of the bumps 112 may also be defined according to the number of the protruding portions 320b. For example, the number of the protruding portions 320b may be "x" and a number of the bump 112 shall be "x-1". In addition, people skilled in the art shall easily realize that the forming methods, features, as well as detailed materials of the liner 300 and the insulating layer 320 are all similar to that of the aforementioned first embodiment or is well known in the art, and will not be redundantly described herein.

It is also worth noting that, since the bump 112 is lower than the base 102, the insulating layer 320 may certainly cover the bump 112, for enhancing the isolation between the fin shaped structures 107 without causing any disturbance to the elements formed sequentially. Also, in one embodiment, the patterned mask 140 may be removed optionally while the chemical mechanical polishing process and the etching back process are performed, due to different structural characteristics of tri-gate or dual-gate transistor device formed subsequently, but is not limited thereto.

Through the above-mentioned steps, the semiconductor device according to the second embodiment of the present invention may be obtained through the above-mentioned processes. In the subsequent process, the present invention may be integrated into a conventional semiconductor process, for example, a general gate process may be performed to forma gate structure (not shown in the drawings) across the fin shaped structures 107. Furthermore, a source/drain process, a selective epitaxial growing process, a silicidation process, a contact etching stop layer process, an interlayer dielectric layer process or a replacement metal gate process may be also performed then. Those processes are similar to a conventional forming process of a transistor and will not be further detailed herein. Except for the aforementioned difference, other forming methods or detailed materials are all similar to those in the aforementioned first embodiment, and will not be redundantly described herein.

The semiconductor device of the present invention may include the substrate 100 having abase 102, at least one fin shaped structure 107 protruded from the base 102, a shallow trench isolation (the insulating layer 320) surrounding the fin shaped structures 107 on the base 102, and a trench 241b recessed from the base 102 of the substrate 100. Preferably, the trench 241b may have a depth dl being smaller than the width $W_f$ of each of the fin shaped structures 107, and the shallow trench isolation further protrudes toward the first trench 241b to form at least one protrusion 320b. In one embodiment, at least one bump 112 is disposed on a surface of the first trench 241b, between the at least one protrusion 320b, such that, the number of the at least one bump 112 may be defined according to the number of the protruding portions 320b. For example, the number of the protruding portions 320b may be "x" and a number of the bump 112 shall be "x-1". Preferably, the at least one bump 112 is lower than the base 102 and has a same pitch as that of the fin shaped structures 107, but not limited thereto. In another embodiment, the substrate may further include a second trench 241c having no bump disposed thereon. Also, in another embodiment, the substrate 100 may further include a tip portion 105 protruding from the base 102, for example, being between the first trench 241b and the fin shaped structures 107, but not limited thereto. In another embodiment, the tip portion 105 may also be disposed between the second trench 241c and the fin shaped structures 107.

According to these, the semiconductor device and the forming method thereof in the present invention mainly forms a trench lower than the shallow trench isolation through a multi-stepped fin cut process, wherein the trench has a depth being smaller than the width of each of the fin shaped structures. Through forming such trench, the present invention enables to provide better isolation without causing any disturbance to the element formed subsequently. Also, since the trench is formed by progressively removing the dummy fin shaped structures and the organic dielectric layer filled therebetween, the present invention also enables to improve the etching effect of the fin shaped structures, and to keep from collapsing or over-etching issues during the fin cutting process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a base;
   a plurality of fin shaped structures protruded from the base, wherein each of the fin shaped structures has a width;
   a first trench, recessed from the base of the substrate and having a depth being smaller than a width of each of the fin shaped structures, wherein a width of the first trench is at least greater than two times of the width of the fin shaped structures;
   at least one bump only disposed on a surface of the first trench, wherein the at least one bump is lower than the base and is higher than a bottom surface of the first trench; and
   a second trench, recessed from the base of the substrate and having a depth being smaller than the width of each of the fin shaped structures.

2. The semiconductor device according to claim 1, wherein a width of the second trench is substantially equal to the width of each of the fin shaped structures.

3. The semiconductor device according to claim 1, further comprising:
   a shallow trench isolation surrounding the fin shaped structures.

4. The semiconductor device according to claim 3, wherein the shallow trench isolation further comprises at least two protruding portions in the first trench, and the at least one bump is disposed between the at least two protruding portions.

5. The semiconductor device according to claim 4, wherein a number of the at least two protruding portions is x and a number of the at least one bump is x−1.

6. The semiconductor device according to claim 1, wherein the at least one bump has a smooth rounding surface.

7. The semiconductor device according to claim 1, wherein the at least one bump has an angle to the surface of the first trench, and the angle is greater than 90 degrees.

8. The semiconductor device according to claim 1, further comprising:
   a tip portion protruding from the base, wherein the tip portion is disposed between the first trench and the fin shaped structures.

9. The semiconductor device according to claim 1, wherein the tip portion is substantially between 1-10 angstrom.

10. The semiconductor device according to claim 1, wherein the at least one bump has a same pitch as a pitch of the fin shaped structures.

11. A method of forming a semiconductor device, comprising:
   providing a substrate having a base and a plurality of fin shaped structures formed on the base, wherein the substrate has a first region and a second region and each of the fin shaped structures has a width;
   forming an organic dielectric layer entirely covering the substrate and the fin shaped structures;
   partially removing the organic dielectric layer disposed in the second region;
   partially removing the fin shaped structures disposed in the second region; and
   further removing the fin shaped structures disposed in the second region, to form a first trench and a least one bump, wherein the first trench recesses from the base of the substrate and has a depth being smaller than a width of each of the fin shaped structures, and a width of the first trench is at least greater than two times of the width of the fin shaped structures, and the at least one bump is higher than a bottom surface of the first trench.

12. The method of forming a semiconductor device of claim 11, wherein the at least one bump is formed between any two of the removed fin shaped structures in the second region.

13. The method of forming a semiconductor device of claim 11, further comprising:
   forming a shallow trench isolation surrounding the fin shaped structures.

14. The method of forming a semiconductor device of claim 13, wherein the shallow trench isolation further comprises at least two protruding portions in the first trench, and a number of the at least two protruding portions is x and a number of the at least one bump is x−1.

15. The method of forming a semiconductor device of claim 11, wherein the substrate further comprises a third region and the method further comprising:
   partially removing the fin shaped structures disposed in the third region while the fin shaped structures in the second region are partially removed; and
   further removing the fin shaped structures disposed in the third region while the fin shaped structures in the second region are further removed, to form a second trench, wherein a width of the second trench is substantially equal to the width of each of the fin shaped structures.

16. The method of forming a semiconductor device of claim 15, wherein the second trench does not have any bump disposed thereon.

17. The method of forming a semiconductor device of claim 11, wherein when partially removing of the fin shaped structures, an etching selectivity between the fin shaped structures relative to the organic dielectric layer is substantially greater than 1.

18. The method of forming a semiconductor device of claim 11, wherein when further removing of the fin shaped structures, an etching selectivity between the fin shaped structures relative to the organic dielectric layer is substantially greater than 1.

* * * * *